(12) United States Patent
Ahles et al.

(10) Patent No.: US 8,429,977 B2
(45) Date of Patent: Apr. 30, 2013

(54) MICROMECHANICAL PRESSURE-SENSOR ELEMENT AND METHOD FOR ITS PRODUCTION

(75) Inventors: Marcus Ahles, Pfullingen (DE); Hubert Benzel, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 29 days.

(21) Appl. No.: 13/035,522

(22) Filed: Feb. 25, 2011

(65) Prior Publication Data

US 2011/0209555 A1    Sep. 1, 2011

(30) Foreign Application Priority Data

Mar. 1, 2010   (DE) .......................... 10 2010 002 463

(51) Int. Cl.
*G01L 9/06* (2006.01)
*G01L 7/00* (2006.01)
*H01C 17/28* (2006.01)

(52) U.S. Cl.
USPC .................................. 73/721; 73/727; 73/756

(58) Field of Classification Search ............. 73/700–756
See application file for complete search history.

(56) References Cited

U.S. PATENT DOCUMENTS

| | | | | |
|---|---|---|---|---|
| 5,471,086 A | * | 11/1995 | Ipposhi et al. | 257/417 |
| 5,631,428 A | * | 5/1997 | Catanescu et al. | 73/724 |
| 7,992,442 B2 | * | 8/2011 | Pinter | 73/714 |
| 2003/0033884 A1 | * | 2/2003 | Beekhuizen et al. | 73/718 |
| 2005/0016288 A1 | * | 1/2005 | Muchow et al. | 73/754 |
| 2005/0186703 A1 | * | 8/2005 | Weiblen et al. | 438/106 |
| 2009/0071259 A1 | * | 3/2009 | Tanaka et al. | 73/725 |
| 2011/0185816 A1 | * | 8/2011 | Has | 73/718 |

FOREIGN PATENT DOCUMENTS

DE    10 2008 04 3084    4/2010

* cited by examiner

*Primary Examiner* — Andre Allen
(74) *Attorney, Agent, or Firm* — Kenyon & Kenyon LLP

(57) ABSTRACT

A very robust sensor element for an absolute-pressure measurement is described, which is suitable for high temperatures and able to be miniaturized to a large extent. The micromechanical pressure-sensor element includes a sensor diaphragm having a rear-side pressure connection and at least one dielectrically insulated piezo resistor for signal acquisition. Furthermore, the pressure-sensor element has a front-side reference volume, which is sealed by a cap structure spanning the sensor diaphragm. The cap structure is realized as thin-film structure.

11 Claims, 3 Drawing Sheets

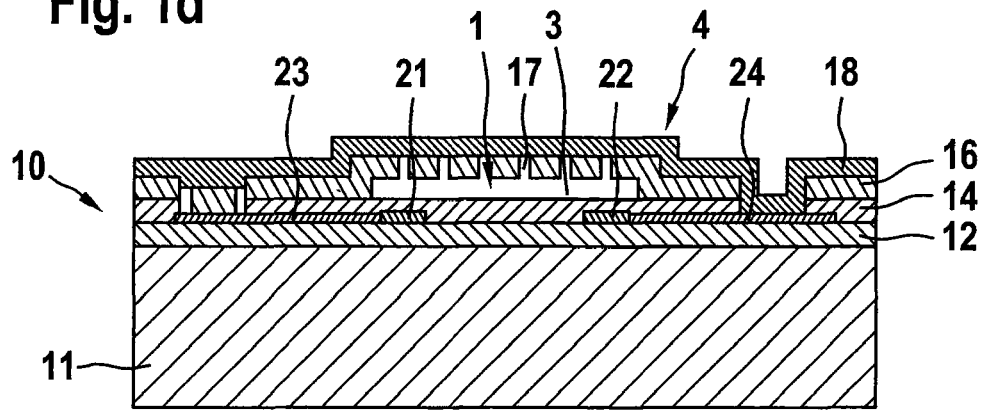
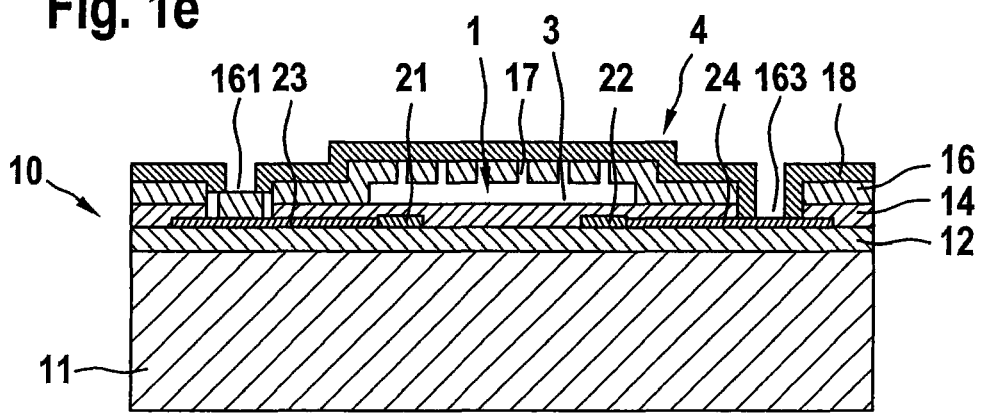
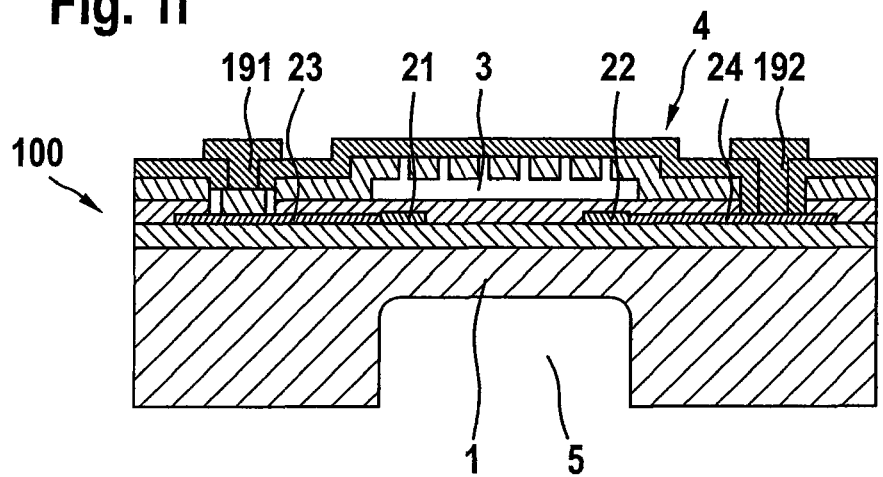

MICROMECHANICAL PRESSURE-SENSOR ELEMENT AND METHOD FOR ITS PRODUCTION

RELATED APPLICATION INFORMATION

The present application claims priority to and the benefit of German patent application no. 10 2010 002 463.5, which was filed in Germany on Mar. 1, 2010, the disclosure of which is incorporated herein by reference.

FIELD OF THE INVENTION

The present invention relates to a micromechanical pressure-sensor element having a sensor diaphragm, a rear-side pressure connection to the sensor diaphragm, and at least one dielectrically insulated piezo resistor for signal acquisition. Furthermore, the present invention relates to a method for producing such a pressure-sensor element.

BACKGROUND INFORMATION

German laid-open patent document DE 10 2008 04 3084 A1 relates to the realization of piezo resistors in a monocrystalline silicon layer by introducing suitable doping into the layer surface. In this printed publication it is proposed to embed the doped resistance region in silicon oxide in order to insulate the piezo resistor from the adjoining layer material and to prevent the occurrence of leakage currents at higher ambient temperatures T>200° C., in particular.

In DE 10 2008 04 3084 A1, a pressure-sensor element, which can be used at high temperatures and has a sensor diaphragm and rear-side pressure connection, is described as one possible use of such insulated piezo resistors. In this case, the piezo resistors are developed in the region of the sensor diaphragm and used for signal acquisition. They have high sensitivity to mechanical stress and are robust even in the long term.

Furthermore, pressure-sensor elements having a rear-side pressure connection to the sensor diaphragm and front-side cap are known, which cap encloses a reference volume or a reference pressure. This type of sensor element is characterized by especially high media resistance. Since the electrical supply lines and the pressure connections are routed separately, i.e., from the front side of the component and from the rear side of the component, neither the electrical supply lines nor the piezo resistors come into contact with the measuring medium. The cap is usually realized in the form of a cap wafer, which is bonded to the sensor wafer.

The cap wafer restricts the possibilities for miniaturizing the pressure-sensor element known from practice, both with regard to the chip surface and the overall height. For example, in addition to the diaphragm area, the chip surface must always be provided with a bond frame region for the cap wafer. The mounting of the known sensor element is also problematic since a flip-chip assembly is out of the question because of the design with the cap wafer.

SUMMARY OF THE INVENTION

The exemplary embodiments and/or exemplary methods of the present invention provide a very robust sensor element for an absolute-pressure measurement, which is usable at very high temperatures and able to be miniaturized to a great extent.

For this purpose, a pressure-sensor element of the type mentioned in the introduction is equipped with a front-side reference volume, which is sealed by a cap structure spanning the sensor diaphragm. According to the exemplary embodiments and/or exemplary methods of the present invention, this cap structure is realized as a thin-film structure. Using sacrificial layer etching, the sensor diaphragm is exposed relative to the cap structure within the framework of the production method. This produces the front-side reference volume.

According to the exemplary embodiments and/or exemplary methods of the present invention, it was recognized that the high-temperature stability of dielectrically insulated piezo resistors not only has an advantageous effect on the potential uses of accordingly equipped components, but also on the possible process controls in their production. For example, the dielectric insulation of piezo resistors integrated into the component surface offers the possibility of using thin film processes on the component surface, without the risk of outdiffusion of the resistance doping. Utilizing this fact, the exemplary embodiments and/or exemplary methods of the present invention combines the provision of a pressure-sensor element with dielectrically insulated piezo resistors for signal acquisition, with the realization of a thin-layer cap structure for enclosing a reference volume.

Therefore, the assembly of the pressure-sensor element according to the present invention requires processing of only one wafer. The patterning and mounting of a second wafer as cap wafer are not required. In addition to these advantages regarding the process technology, the structure of the pressure-sensor element according to the present invention also yields advantages in connection with its mounting on a component base material. A thin-film cap structure requires much less space than a cap wafer as far as the required chip surface is concerned, but also with regard to the overall height. The low overall height of the cap structure allows the pressure-sensor element according to the present invention to be assembled using flip chip technology.

There are basically various possibilities for realizing dielectrically insulated piezo resistors in the sensor diaphragm of the pressure-sensor element according to the present invention.

In one advantageous variant, the at least one piezo resistor is formed in a functional layer which is electrically insulated from a carrier substrate by a dielectric layer. For this purpose the sensor structure could be realized on the basis of an SOI (silicon on insulator) wafer, for instance. In this case the silicon layer of the SOI wafer serves as functional layer. Here, the at least one piezo resistor is able to be realized in an especially uncomplicated manner in the form of a doped region which is insulated from adjoining layer regions by appropriate patterning of the silicon functional layer, and from the carrier substrate via the silicon oxide layer.

In one additional advantageous variant, the dielectric insulation layer for the piezo resistor is produced only retroactively. In this case the piezo resistor is realized in a monocrystalline or polycrystalline silicon layer. A resistance region adjoining the surface of the silicon layer first is doped for this purpose. Then, a region of the silicon layer which adjoins the doped resistance region at the sides and extends underneath the doped resistance region, is rendered porous by etching. This porous silicon is finally oxidized. In this way the piezo resistor is retroactively embedded in a silicon oxide region, which is likewise formed within the silicon layer.

As already mentioned, the cap structure of the pressure-sensor element according to the present invention is realized using thin-film technology. The reference volume is produced by sacrificial layer etching, in which the material of the sacrificial layer is dissolved and removed between the diaphragm surface and a carrier layer. Thus, the substrate layer of the cap structure delimiting the reference volume has etching access openings. The thin-film design of the cap structure also includes at least one sealing layer, which is deposited on the carrier layer once the material of the sacrificial layer has been dissolved, in order to seal the etching access openings and to enclose a defined reference pressure in the reference volume. This may be a vacuum.

A variety of materials may basically be considered for the sacrificial layer, the carrier layer and for etching the sacrificial layer, as long as these materials are adapted to each other.

If the thin-film cap structure of the pressure-sensor element according to the present invention is to be produced at relatively low process temperatures, then the use of germanium GE suggests itself as sacrificial layer material at a deposition temperature of around 600° C. In this case SiGe is advantageously used for the carrier layer because the germanium underneath the carrier layer is able to be removed very rapidly and at high selectivity with respect to the SiGe, for instance with the aid of XeF2 or also ClF3, within the framework of the sacrificial layer etching process. For example, this material combination suggests itself when the pressure-sensor element according to the present invention is equipped with diffused switching components and an outdiffusion of the doping material cannot be ruled out.

If all circuit components of the pressure-sensor element according to the present invention are dielectrically insulated in the manner of the piezo resistors, even higher process temperatures may be used in the production of the cap structure. In this case an oxide layer, e.g., TEOS, may simply be deposited as sacrificial layer and a polysilicon layer as carrier layer, which usually takes place at temperatures around 1180° C.

The further method steps for producing the pressure-sensor element according to the present invention are described in greater detail in the following text in connection with the figures.

As previously discussed already, there are various possibilities for realizing and further developing the teaching of the present invention in an advantageous manner. In this regard, reference is made to the claims subordinate to the independent claims on the one hand and to the following description of several exemplary embodiments of the present invention with reference to the figures on the other.

BRIEF DESCRIPTION OF THE DRAWINGS

FIGS. 1a, 1b, 1c, 1d, 1e, and 1f, illustrate the process sequence for producing a pressure-sensor element according to the present invention, with the aid of schematic sectional views through an SOI wafer in successive production stages.

DETAILED DESCRIPTION

Figure 1A:
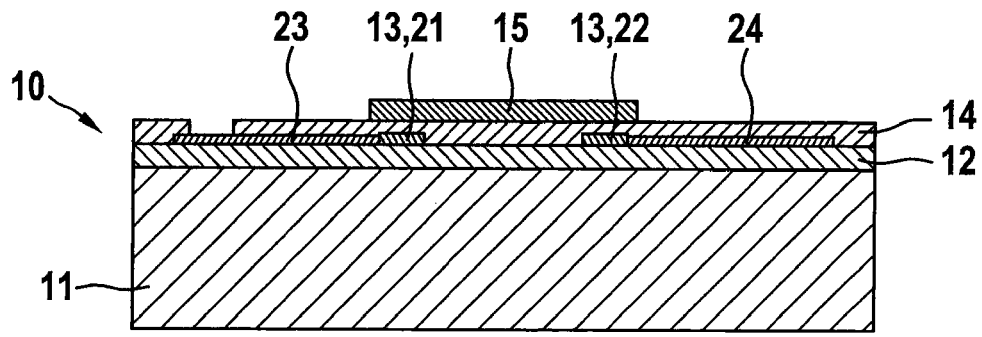

The process sequence illustrated in FIGS. 1a through 1f is based on an SOI wafer 10. It includes a silicon substrate 11 as carrier of an oxide layer 12, on top of which a monocrystalline silicon layer 13 is disposed as functional layer. Piezo resistors 21 and 22 having supply leads 23, 24 are developed in Si functional layer 13 in the form of doped regions. Through appropriate patterning of Si functional layer 13, these doped regions are electrically insulated from the other layer regions. Oxide layer 12 acts as electrical insulation of piezo resistors 21, 22 and supply leads 23, 24 relative to substrate 11. In the exemplary embodiment shown here, patterned Si functional layer 13 has been provided with a dielectric cover layer 14. This may be, for example, an oxide layer or also a nitride layer.

The production method described here also includes the realization of bond pads for the contacting of piezo resistors 21 and 22. Two different realization forms of bond pads are elucidated in connection with FIGS. 1a through 1f, although only one type of bond pads is generally realized in the layer configuration of a pressure-sensor element. To produce a bond pad for piezo resistor 21 in the left half of the figure, dielectric cover layer 14 was opened up in the region of supply lead 23.

Piezo resistors 21, 22 were placed in the region of the sensor diaphragm yet to be exposed (cf. FIG. 1f). FIG. 1a shows SOI wafer 10 following the deposition of a sacrificial layer 15 above piezo resistors 21, 22 in the region of the diaphragm surface. Toward this end, the material of the sacrificial layer is first deposited across the entire surface of the layer structure in order to then remove it again outside the diaphragm region within the framework of corresponding patterning. Silicon oxide, polysilicon, silicon germanium SiGe or also germanium Ge, for example, may be used as material for the sacrificial layer in this case.

Figure 1B:
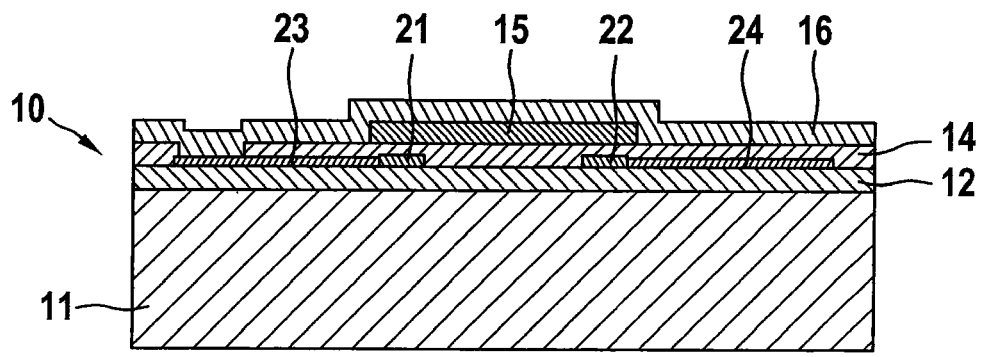

Then, a carrier layer 16 for the cap structure to be produced (cf. FIG. 1d) is deposited on the layer structure illustrated in FIG. 1a. The material of carrier layer 16 must be selected to match the material of the sacrificial layer. In the sacrificial process, particular attention must be paid that the material of the sacrificial layer is attacked with high selectivity relative to the material of carrier layer 16. In case of a silicon oxide sacrificial layer, carrier layer 16 may be realized in the form of a polysilicon layer, for example, while carrier layer 16 is advantageously formed from SiGe in case of a Ge sacrificial layer. FIG. 1b shows the layer structure having carrier layer 16 deposited across the entire surface. In view of the realization of the bond pad for piezo resistor 21, it should be noted here that carrier layer 16 is in direct contact with the supply lead of piezo resistor 21 due to the patterning of dielectric cover layer 14.

In any event, carrier layer 16 is provided with many relatively small etching access openings 17 in the diaphragm region in order to expose the top surface of the diaphragm in a subsequent sacrificial layer etching process relative to the cap structure. Carrier layer 16 is utilized as part of the vertical supply lead of the bond pad in the region of supply lead 23 of piezo resistor 21. For this reason, carrier layer 16 is made electrically conductive at least in this bond pad region 161, for example in the form of a doped polysilicon or SiGe layer. When patterning carrier layer 16, bond pad region 161 is electrically insulated from the adjoining layer regions by a circumferential trench 162. This variant has the advantage that the carrier layer in the bond pad is retained and the bond pad therefore forms only a relatively small step in the component surface even in the case of a thick carrier layer.

Figure 1C:
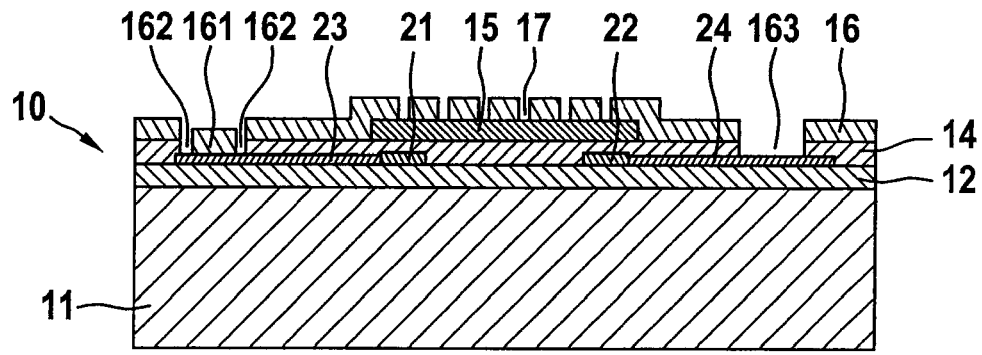

This patterning of substrate 16 was performed by trench etching in this case. To realize a bond pad for piezo resistor 22 on the right side of the figure, carrier layer 16 and then also dielectric cover layer 14 lying underneath were first opened in the region of the supply lead in order to create a contact opening 163 to supply lead 24 of piezo resistor 22. The result of the patterning of carrier layer 16 is illustrated in FIG. 1c.

In a further process step, the front side of diaphragm 1 is then exposed by removing sacrificial layer material 15 underneath carrier layer 16. The etch attack in this sacrificial layer etching process takes place via etching access openings 17 in carrier layer 16, which is laterally undercut in etching. Due to the number and placement of etching access openings 17, a coherent reference volume 3 is produced between diaphragm 1 and carrier layer 16. FIG. 1d shows the layer structure following the deposition of a sealing layer 18 on patterned carrier layer 16. Reference volume 3 was sealed by filling the many small etching access openings 17 with the material of sealing layer 18. A defined reference pressure then prevails in reference volume 3, a vacuum may be enclosed here. A polysilicon layer, a SiGe layer or also a silicon oxide layer (TEOS), for example, may be deposited on the layer structure in the form of sealing layer 18. Furthermore, even more layers such as a nitride layer as passivation may be added to the layer structure of cap structure 4. It has shown to be especially advantageous if carrier layer 16 and sealing layer 18 are made of the same material such as polysilicon, for example. For this makes it possible to ensure in an uncomplicated manner that reference volume 3 remains hermetically sealed on a long-term basis even when the specifications call for high temperature variations.

FIG. 1e shows the layer structure after sealing layer 18 has been opened in bond pad region 161 and above contact opening 163.

This is followed by the deposition and patterning of a metal layer for realizing bond pads 191 and 192. They provide the external electrical contacting, e.g., by wire-bonding or with the aid of solder bumps, within the scope of flip-chip mounting.

In the exemplary embodiment described here, the rear side of sensor diaphragm 1 is exposed only after the processing of the front side has been concluded. Rear-side pressure connection 5 is realized by bulk-micromechanical process steps such as trench etching or also KOH etching. These etching processes, which start on the rear side of the wafer may be time-controlled. In addition, there is also the possibility of providing an etch stop boundary in the layer structure, such as an oxide layer as trench stop, or a pn etch stop for the KOH etching, for instance. Pressure-sensor element 100 according to the present invention and shown in FIG. 1f is the result of the afore-described production method. This pressure-sensor element 100 includes a sensor diaphragm 1 having at least one dielectrically insulated piezo resistor 21, 22 for signal acquisition, a rear-side pressure connection 5, and a front-side reference volume 3, which is sealed by a cap structure 4 covering sensor diaphragm 1, cap structure 4 being realized as thin-film structure.

Figure 2:
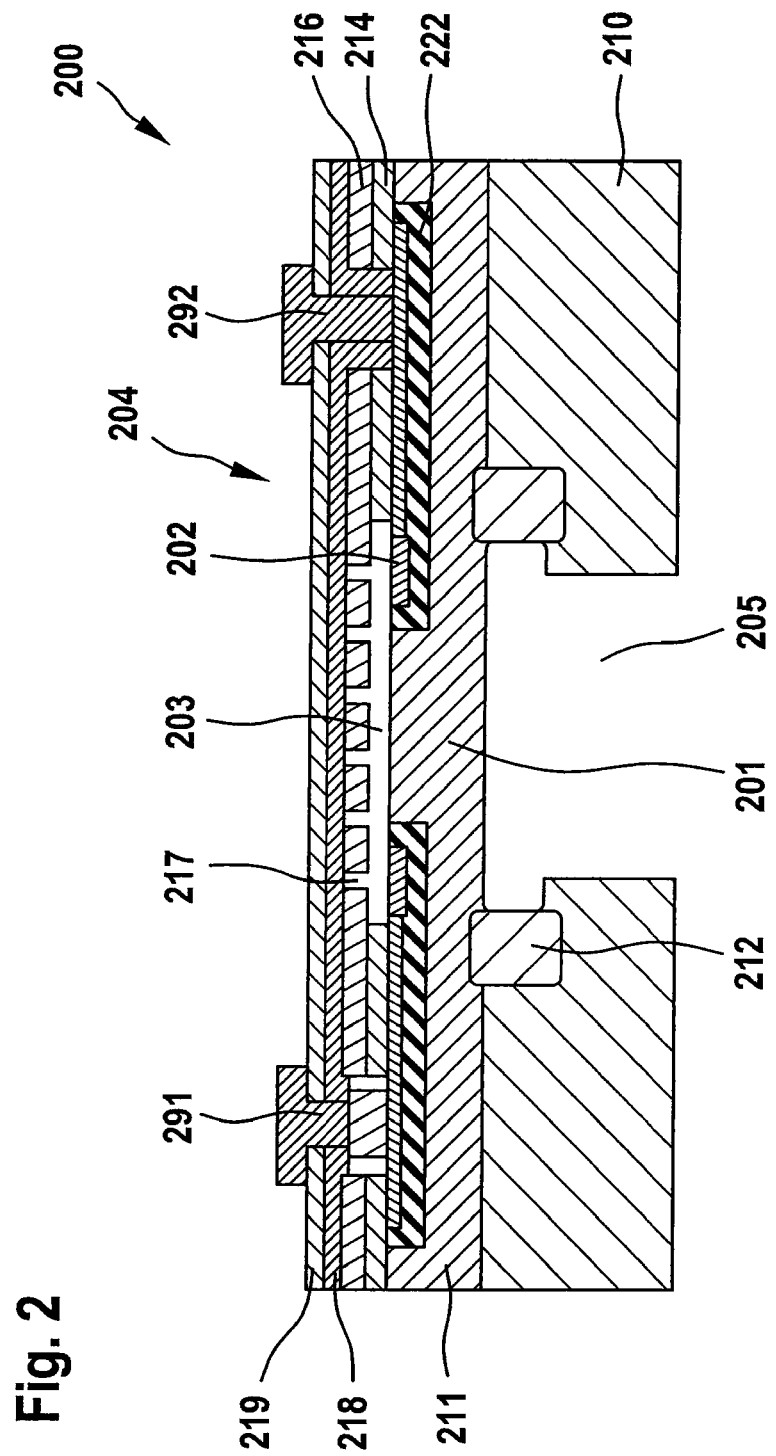
FIG. 2 shows a schematic sectional view through an additional pressure-sensor element according to the present invention.

Pressure-sensor element 200 shown in FIG. 2 also includes a sensor diaphragm 201 having dielectrically insulated piezo resistors 202 for signal acquisition, a rear-side pressure connection 205, and a front-side reference volume 203, which is sealed by a thin-film cap structure 204 covering sensor diaphragm 201.

However, this structure was not realized starting with an SOI wafer, but starting with a p$^-$-silicon substrate 210, on which an n$^-$-epitaxial layer 211 has been deposited. In the case of pressure-sensor element 200, a buried oxide layer was first produced underneath n$^-$-epitaxial layer 211, which extends across the diaphragm region and is delimited by n-doped regions 212 in substrate 210 along the sides. This buried oxide layer is used as etch stop for the rear-side trench process and was removed again once rear-side pressure connection 205 had been produced. Piezo resistors 202 are disposed in the region of sensor diaphragm 201, as are piezo resistors 21 and 22 of pressure-sensor element 100. In this case they are realized together with their supply leads in the form of a doped surface region of monocrystalline n$^-$-epitaxial layer 211 and embedded in a silicon oxide region 222, which is formed within n$^-$-epitaxial layer 211. N$^-$-epitaxial layer 211 prepared in this manner was then provided with a dielectric cover layer 214 in the form of an oxide layer. In the exemplary embodiment shown here, this oxide layer 214, for one, is used for the electrical insulation of piezo resistors 202 and supply leads from thin-film cap structure 204. For another, oxide layer 214 is used as sacrificial layer in the diaphragm region.

A polysilicon layer 216 was deposited on top of oxide layer 214 as carrier layer 216 for cap structure 204, and provided with etching access openings 217 above the diaphragm region. Via these etching access openings 217, the silicon oxide of cover layer 214 was removed from the region between sensor diaphragm 201 and carrier layer 216. Cavity 203 produced in the process forms the reference volume of pressure-sensor element 200. Here, piezo resistors 202 are located in the diaphragm surface and thus are distanced from the neutral fiber of diaphragm 201 as much as possible, which imbues sensor element 200 with especially high sensitivity. An additional polysilicon layer was then deposited above polysilicon carrier layer 216 as sealing layer 218. To complete the thin-film structure of cap structure 204, a nitride layer is provided as passivation 219.

With regard to the realization of bond pads 291 and 292 of pressure-sensor element 200, reference is made to the corresponding description in connection with bond pads 191 and 192 of sensor element 100.

What is claimed is:

1. A micromechanical pressure-sensor element, comprising:
    a sensor diaphragm;
    a rear-side pressure connection to the sensor diaphragm;
    at least one dielectrically insulated piezo resistor for signal acquisition; and
    a front-side reference volume, which is sealed by a cap structure spanning the sensor diaphragm, wherein the cap structure is a thin-film structure.

2. The pressure-sensor sensor of claim 1, wherein the at least one piezo resistor is formed in a functional layer, which is electrically insulated from a carrier substrate by a dielectric layer.

3. The pressure-sensor sensor of claim 2, wherein the at least one piezo resistor is realized in the form of a doped region of a patterned silicon functional layer above a silicon oxide layer.

4. The pressure-sensor sensor of claim 1, wherein the at least one piezo resistor is in the form of a doped surface region of a monocrystalline or polycrystalline silicon layer, and wherein the piezo resistor is embedded in a silicon oxide region, which is developed within the silicon layer.

5. The pressure-sensor element of claim 1, wherein at least the first carrier layer, delimiting the reference volume, of the cap structure is provided with etching access openings, and wherein the etching access openings are sealed by at least one sealing layer deposited on the carrier layer.

6. A method for producing a micromechanical pressure-sensor element, the method comprising:
    providing a sensor diaphragm having a rear-side pressure connection to the sensor diaphragm;
    providing at least one dielectrically insulated piezo resistor for signal acquisition;
    following the realization of the at least one dielectrically insulated piezo resistor, producing a cap structure in a region of the sensor diaphragm above the sensor diaphragm using thin-film technology; and
    exposing the sensor diaphragm relative to the cap structure by performing sacrificial layer etching, during which a front-side reference volume is produced.

7. The method of claim 6, wherein the at least one piezo resistor is formed in a functional layer, which is electrically insulated from a carrier substrate by a dielectric layer, in that the functional layer is doped in a resistance region and patterned such that the resistance region is insulated from adjoining regions of the functional layer.

8. The method of claim 6, wherein the at least one dielectrically insulated piezo resistor is realized in a monocrystalline or polycrystalline silicon layer, in that first a resistance region adjoining the surface of the silicon layer is doped, in that a region of the silicon layer which adjoins the doped resistance region along the sides and extends underneath the doped resistance region is rendered porous by etching, and in that the porous silicon is oxidized.

9. The method of claim 6, wherein the cap structure above the sensor diaphragm is produced in that:

a sacrificial layer is deposited at least on the diaphragm surface, at least one carrier layer superposed to the diaphragm region is deposited on top of the sacrificial layer, the carrier layer is provided with etching access openings above the diaphragm region, the sacrificial layer material is removed by way of the etching access openings in the carrier layer, and at least one sealing layer is deposited on the carrier layer, the etching access openings being sealed in the process.

10. The method of claim 6, wherein germanium (Ge) is used as sacrificial layer material, and SiGe is used for the carrier layer, and the sacrificial layer material is removed with the aid of at least one of XeF2 and ClF3.

11. The method of claim 6, wherein the sacrificial layer is realized in the form of an oxide layer, and the carrier layer is realized in the form of a polysilicon layer.

* * * * *